United States Patent
Van Schaijk et al.

(10) Patent No.: US 8,525,250 B2
(45) Date of Patent: Sep. 3, 2013

(54) SONOS MEMORY DEVICE WITH REDUCED SHORT-CHANNEL EFFECTS

(75) Inventors: Robertus T. F. Van Schaijk, Eindhoven (NL); Francois Neuilly, Colomby sur Thaon (FR); Michiel J. Van Duuren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 465 days.

(21) Appl. No.: 12/158,131

(22) PCT Filed: Dec. 18, 2006

(86) PCT No.: PCT/IB2006/054917
§ 371 (c)(1),
(2), (4) Date: Jul. 16, 2008

(87) PCT Pub. No.: WO2007/072396
PCT Pub. Date: Jun. 28, 2007

(65) Prior Publication Data
US 2008/0272427 A1 Nov. 6, 2008

(30) Foreign Application Priority Data

Dec. 22, 2005 (EP) ..................................... 05112822

(51) Int. Cl.
*H01L 29/792* (2006.01)
*H01L 21/3205* (2006.01)

(52) U.S. Cl.
USPC .................. 257/324; 257/327; 257/E29.309; 438/216; 438/261; 438/591

(58) Field of Classification Search
USPC ................... 257/324, 327, E29.13, E29.259, 257/E29.267, E29.309; 438/216, 261, 591
See application file for complete search history.

(56) References Cited

U.S. PATENT DOCUMENTS

| 7,202,521 | B2 | 4/2007 | Kim et al. |
| 7,344,923 | B2 | 3/2008 | Hofmann et al. |
| 7,498,632 | B2 * | 3/2009 | Lee ............................... 257/324 |
| 2004/0097044 | A1 | 5/2004 | Kim et al. |
| 2005/0145926 | A1 | 7/2005 | Lee |
| 2005/0227435 | A1 * | 10/2005 | Oh et al. ........................ 438/257 |
| 2006/0097310 | A1 * | 5/2006 | Kim et al. ..................... 257/321 |

FOREIGN PATENT DOCUMENTS

| CN | 1407626 A | 4/2003 |
| CN | 1607668 A | 4/2005 |
| WO | 2004107435 A1 | 12/2004 |

* cited by examiner

*Primary Examiner* — Matthew E Warren

(57) ABSTRACT

According to certain embodiments, a non-volatile memory device on a semiconductor substrate having a semiconductor surface layer comprises a channel region that extends in a first direction between the source and drain regions. The gate is disposed near the channel region and the memory element is disposed in between the channel region and the gate. The channel region is disposed within a beam-shaped semiconductor layer, with the beam-shaped semiconductor layer extending in the first direction between the source and drain regions and having lateral surfaces extending parallel to the first direction. The memory element comprises a charge-trapping stack so as to embed therein the beam-shaped semiconductor layer in a U-shaped form.

27 Claims, 7 Drawing Sheets

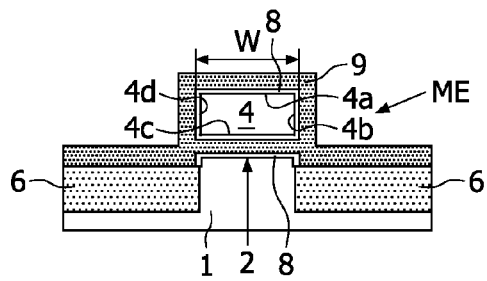
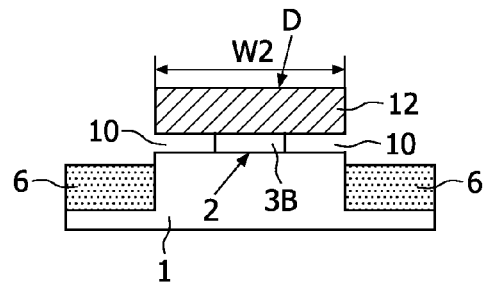
FIG. 2a     FIG. 2b
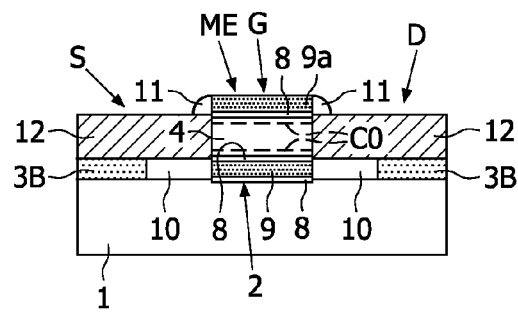
FIG. 2c
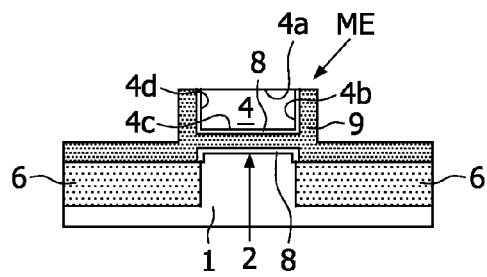
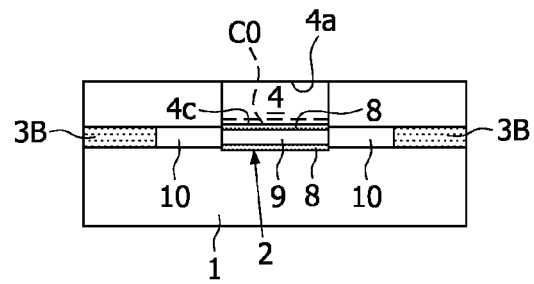
FIG. 2d     FIG. 2e

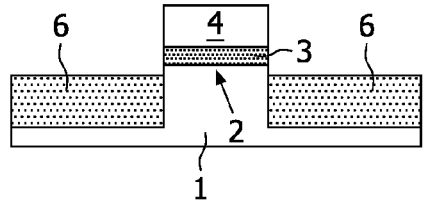 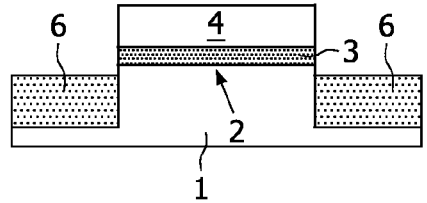
FIG. 5a            FIG. 5b
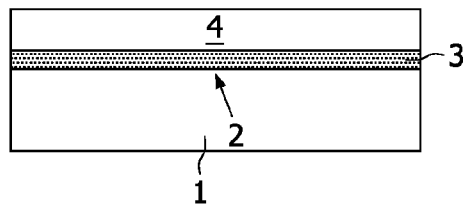
FIG. 5c
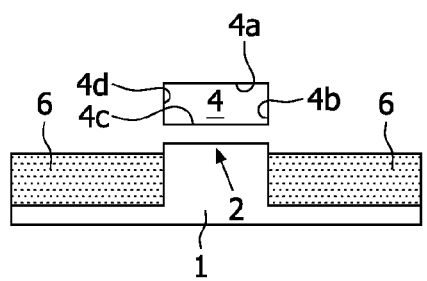 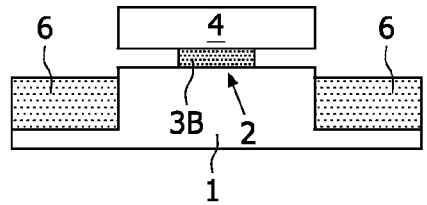
FIG. 6a            FIG. 6b
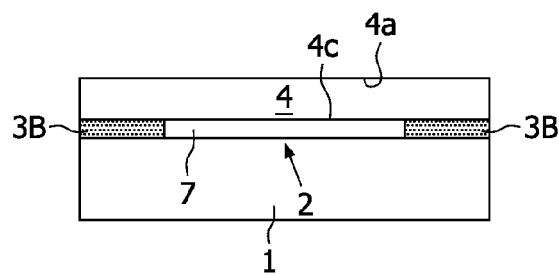
FIG. 6c

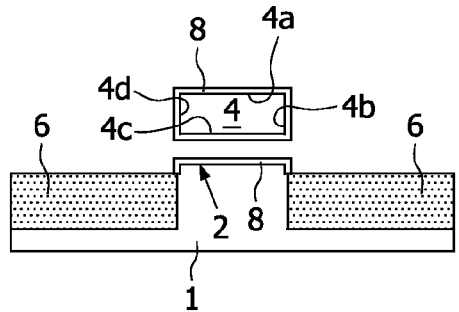
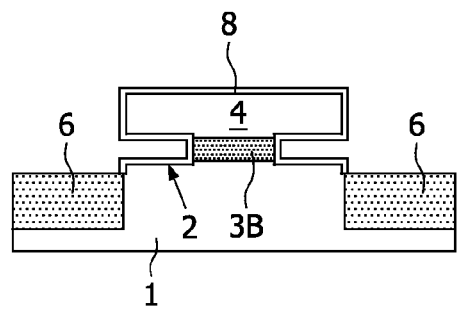
FIG. 7a  FIG. 7b
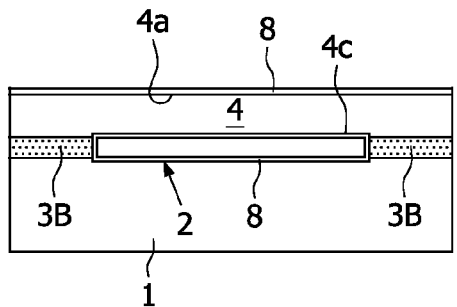
FIG. 7c
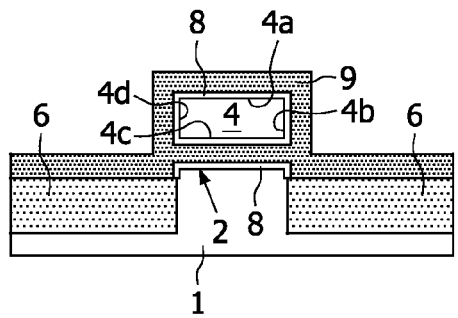
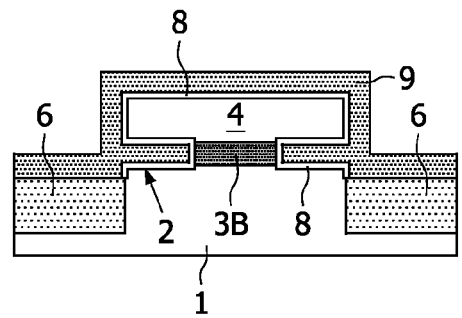
FIG. 8a  FIG. 8b
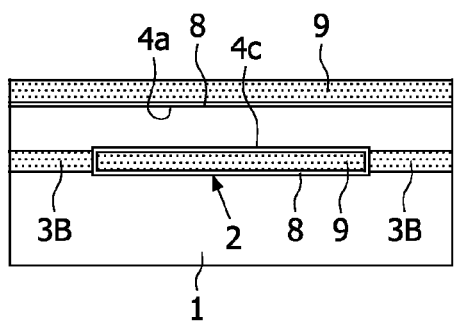
FIG. 8c

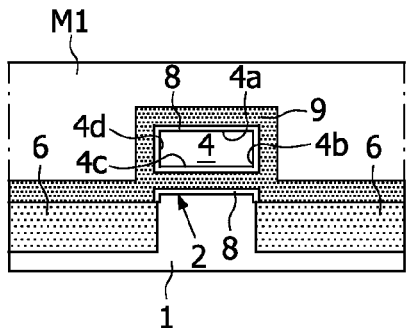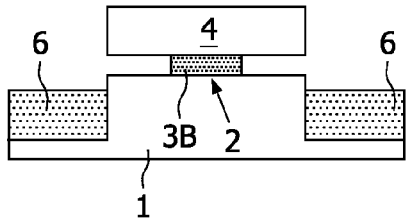
FIG. 9a    FIG. 9b
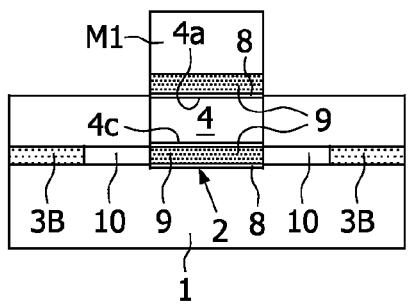
FIG. 9c
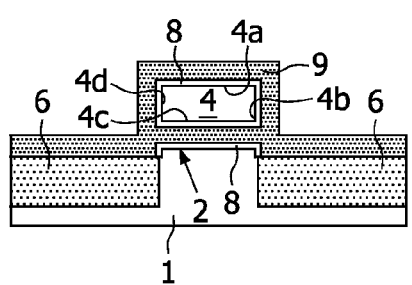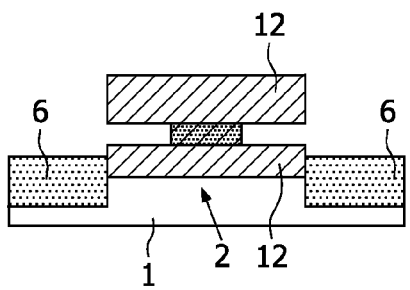
FIG. 10a    FIG. 10b
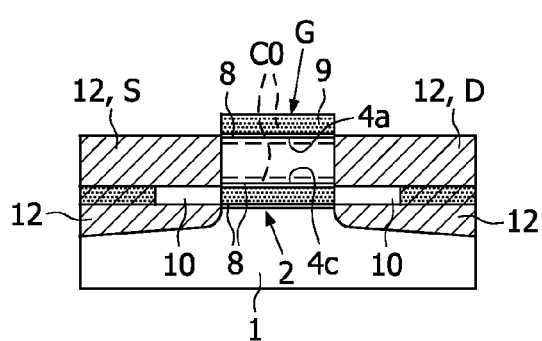
FIG. 10c

SONOS MEMORY DEVICE WITH REDUCED SHORT-CHANNEL EFFECTS

The present invention relates to a non-volatile memory device, in particular a SONOS non-volatile memory device. Also, the present invention relates to method of manufacturing such a non-volatile memory device. Moreover, the present invention relates to a semiconductor device comprising such a non-volatile memory device.

Due to the persistent demand for semiconductor devices with increasing numbers of memory device and/or with a higher density of memory devices, the micro-electronics industry is making continuous efforts to reduce the sizes of the memory devices.

Memory devices are typically based on planar transistor layouts which comprise source and drain areas, a channel between the source and drain areas and a gate for controlling the channel.

A reduction in dimensions of a planar transistor layout typically involves a reduction of the channel length between the source and drain areas.

Smaller channel dimensions may adversely affect the function of the transistor owing to so-called short-channel effects. During use, the electric field between the active areas (source and drain) becomes too high in aggressively scaled devices, and lateral charge leakage may result in that case.

In the prior art, double-gate and tri-gate architectures for transistors have been disclosed that improve the electrostatic charge control of the channel region and provide an efficient screening of the electric field between active areas. The above-mentioned concepts relate to MOSFET layouts.

SONOS memory devices comprise non-volatile memory cells built up from a charge-trapping stack of a first insulator layer, a charge-trapping layer and a second insulator layer, for example a stack of Semiconductor (silicon) Oxide (silicon) Nitride (silicon) Oxide Semiconductor, wherein the ONO part of the stack consists of, consecutively, a first silicon dioxide layer, a silicon nitride layer, and a second silicon dioxide layer. The first silicon dioxide layer is located on a semiconductor (substrate) layer. On top of the second silicon dioxide layer lies a further semiconductor layer (e.g., poly-silicon).

The memory function of a SONOS device is based on the capability of the ONO stack for trapping electrical charge, which can be retained for long periods. Furthermore, the presence of electric charge in the ONO stack can be manipulated relatively easily by charge injection and tunneling effects, which renders possible a relatively simple programming and erasing of memory cells of this type.

It is an object of the present invention to reduce short channel effects in a non-volatile memory device, in particular a SONOS non-volatile memory device.

The present invention provides a non-volatile memory device on a semiconductor substrate, comprising a source region, a drain region, a channel region, a memory element, and a gate, the channel region extending in a first direction between the source region and the drain region; the gate being disposed near the channel region; the memory element being disposed in between the channel region and the gate, the channel region being disposed within a beam-shaped semiconductor layer;

the beam-shaped semiconductor layer extending in the first direction between the source and drain regions and having lateral surfaces extending parallel to the first direction, and the memory element comprising a charge-trapping stack which covers on said lateral surfaces at least the lower surface directed towards the semiconductor surface layer and the side surfaces which are directly connecting to the lower surface so as to embed the beam-shaped semiconductor layer in a U-shaped form of the charge-trapping stack.

Advantageously, the occurrence of short-channel effects is strongly reduced in the non-volatile memory element of the present invention through an improvement in the electrostatic charge control of the channel region.

Also, the present invention provides a method of manufacturing a non-volatile memory device on a semiconductor substrate, the non-volatile memory device comprising a source region, a drain region, a channel region, a memory element, and a gate, the channel region extending in a first direction between the source region and the drain region; the gate being disposed near the channel region; the memory element being disposed in between the channel region and the gate, the method comprising the steps of:

creating a beam-shaped semiconductor layer for accommodating the channel region, said beam-shaped semiconductor layer extending in the first direction between the source and drain regions and having lateral surfaces extending parallel to the first direction, providing as a memory element a charge-trapping stack which covers of said lateral surfaces at least the lower surface directed towards the semiconductor surface layer and the side surfaces which are directly connecting to the lower surface so as to embed the beam-shaped semiconductor layer in a U-shaped form of the charge trapping stack.

Moreover, the present invention provides a semiconductor device comprising a non-volatile memory device as described above.

The invention will be explained in more detail below with reference to a few drawings in which illustrative embodiments of the invention are shown. It will be appreciated by those skilled in the art that other alternative and equivalent embodiments of the invention may be conceived and carried into practice without departing from the true spirit of the invention, the scope of the invention being limited by the appended claims only.

FIGS. 2a, 2b, 2c are cross-sectional views of the non-volatile memory element of FIG. 1;

FIGS. 2d and 2e show an alternative embodiment of the non-volatile memory element in cross-sections taken on A-A and C-C, respectively;

FIGS. 5a, 5b, 5c show the non-volatile memory element after a next processing step in the first, second, and third cross-sectional views, respectively;

FIGS. 6a, 6b, 6c show the non-volatile memory element after a further processing step in the first, second, and third cross-sectional views, respectively;

FIGS. 7a, 7b, 7c show the non-volatile memory element after a successive further processing step in the first, second, and third cross-sectional views, respectively;

FIGS. 8a, 8b, 8c show the non-volatile memory element after yet a further processing step in the first, second, and third cross-sectional views, respectively;

FIGS. 9a, 9b, 9c show the non-volatile memory element after a subsequent processing step in the first, second, and third cross-sectional view, respectively;

FIGS. 10a, 10b, 10c show the non-volatile memory element after an alternative further processing step in the first, second, and third cross-sectional views, respectively.

FIG. 1 is a plan view of SONOS non-volatile memory devices according to the present invention.

Figure 1:
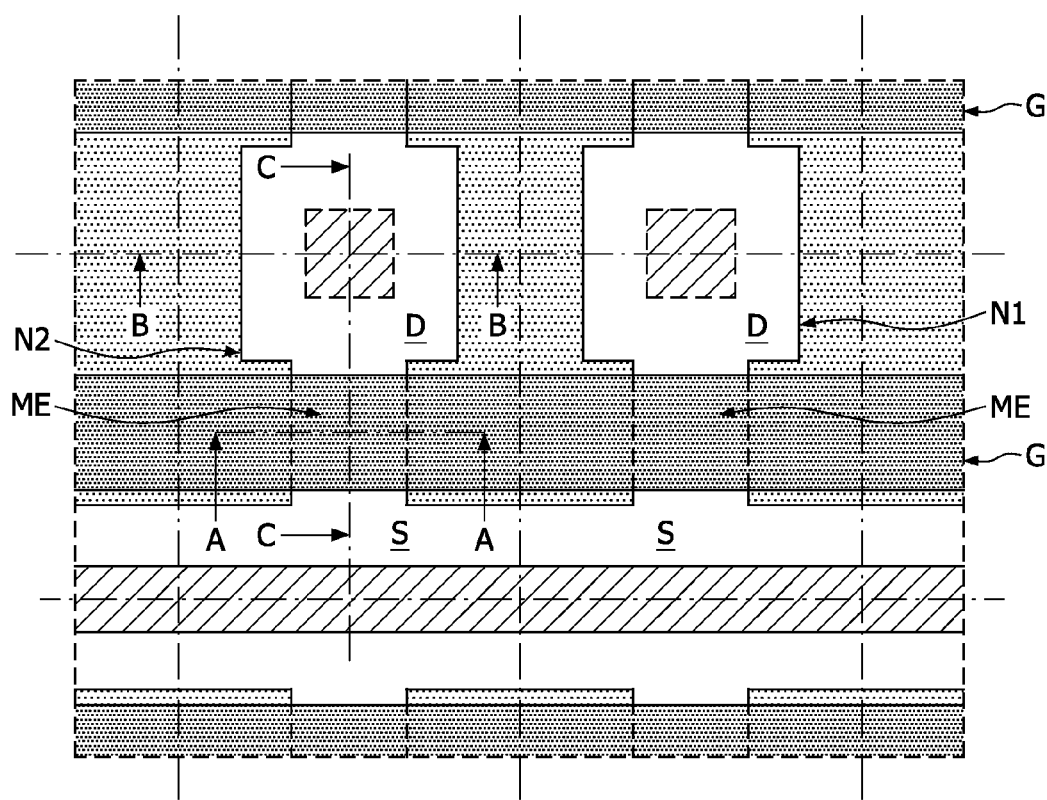
FIG. 1 is a plan view of a non-volatile memory element according to the present invention.

FIG. 1 shows a memory array comprising at least two SONOS memory devices N1, N2. The SONOS memory devices N1, N2 are adjacent to each other. The area of each SONOS memory device N1, N2 is schematically indicated by a dashed-line rectangle.

Each SONOS memory device N1, N2 comprises a source region S, a drain region D, and at least one poly gate G. The poly gate G is disposed above a semiconductor channel region C0 which extends between the source and drain regions S, D in a first direction and which comprises a memory element ME, which in its turn comprises a SONOS-based charge-trapping stack. The structure of each memory device N1, N2 is isolated from adjacent memory devices by a shallow trench isolation region STI.

In this configuration the source S and the poly gate G are arranged as a source line S and a poly gate line G, respectively, each common to the adjacent SONOS memory devices N1, N2.

Note that the width of the drain region D is greater than the width of the memory element ME, both widths taken in the direction parallel to the linear direction of the common source line S. Also, the width of the source line S (perpendicular to its linear direction) is greater than the width of the memory element ME.

Below, the SONOS memory device according to the present invention will be explained in more detail with reference to some manufacturing steps for manufacturing the SONOS memory device illustrated by a number of cross-sectional views.

One cross-section is taken on the line A-A, which is parallel to the linear direction of the common source S (perpendicular to the first direction) and crosses the area of the memory element ME. A second cross-section is taken on the line B-B, which is parallel to the common source S and crosses the area of the drain D. A third cross-section is taken on the line C-C, which is perpendicular to the linear direction of the common source S and crosses the area of the source S, the memory element ME, and the drain D.

In the remaining FIGS. 2a, 2b, 2c 10a, 10b, 10c, all Figure numbers with suffix 'a' relate to the first cross-section A-A, all Figure numbers with suffix 'b' relate to the second cross-section B-B, and all Figure numbers with suffix 'c' relate to the third cross-section C-C.

FIGS. 2a, 2b, 2c show cross-sectional views of the non-volatile memory device of FIG. 1.

FIG. 2c shows the cross-section of the non-volatile device of FIG. 1 in the direction from the source region S to the drain region D. A semiconductor channel region C0, which comprises a non-volatile memory element ME, is located between the source and drain regions S, D.

Residual epitaxial SiGe layers 3b (SiGe: silicon-germanium) are located on a monocrystalline silicon surface layer 2 of a semiconductor substrate 1 in the source and drain regions S, D. A beam-shaped epitaxial Si layer 4 extends in a first direction X between the source region S and the drain region D. The beam-shaped epitaxial Si layer 4 comprises doped regions 12 at the location of the source and drain regions S, D.

The non-volatile memory element ME comprises a charge-trapping stack 8 located on the surface of the beam-shaped epitaxial Si layer 4 and a poly silicon layer 9 which is located on the charge-trapping stack 8. A channel length L is indicated here.

As shown in cross-section A-A of FIG. 2a, the beam-shaped epitaxial Si layer 4 has a substantially rectangular cross-section with four lateral surfaces 4a, 4,b, 4c, 4d which extend parallel to the first direction X (which coincides with the linear direction of the beam-shaped epitaxial Si layer 4).

In the non-volatile memory element ME, the charge-trapping stack 8 covers the beam-shaped epitaxial Si layer 4 completely on its four lateral surfaces 4a, 4b, 4c, 4d. The poly silicon layer 9 is arranged to cover the charge-trapping stack 8 completely. Below the beam-shaped epitaxial silicon layer 4, a fin-shaped monocrystalline silicon surface layer 2 of a semiconductor substrate 1 is present with substantially a same width W as the beam-shaped epitaxial Si layer 4. Isolation layers 6 flank the fin-shaped monocrystalline silicon surface layer 2 to provide a shallow trench isolation STI.

The monocrystalline silicon surface layer 2 is covered with the charge-trapping stack 8 in the cross-section A-A. The poly silicon layer 9 is also present in between the monocrystalline silicon surface layer 2 covered with the charge trapping stack 8 and the side of the beam-shaped epitaxial silicon layer 4 facing the monocrystalline silicon surface layer 2.

It is noted that the upper surface 4a of the beam-shaped epitaxial Si layer 4 may alternatively be processed so as to obtain an exposed upper surface 4a on which, for example, a further electrode or structure may be located. In that case the charge-trapping stack 8 will cover the beam-shaped epitaxial Si layer 4 in a U-shape on its lower surface 4c (directed towards the monocrystalline silicon surface layer 2) and the side surfaces 4b and 4d (which are directly connecting to the lower surface 4c). The poly-Si gate layer 9 covers the lower surface 4c and side surfaces 4b, 4d.

A cross-section A-A of this embodiment is shown in FIG. 2d. A cross-section C-C is shown in FIG. 2e. In FIGS. 2d and 2e, identical entities have been given the same reference numerals as in the preceding Figures.

FIG. 2b shows the cross-section B-B of the drain region D. In FIG. 2b, identical entities have been given the same reference numerals as in the preceding Figures. Above the monocrystalline silicon surface layer 2, which is block-shaped and relatively wider (W2>W) than the monocrystalline silicon surface layer 2 at the location of the non-volatile memory element ME (cross-section A-A), the residual epitaxial SiGe layer 3b is located. The epitaxial silicon layer 4 is located on top of the residual epitaxial SiGe layer 3b. The width W2 of the epitaxial silicon layer 4 is substantially greater at the cross-section B-B than at the cross-section A-A.

Gap regions 10 may be present between the doped regions 12 and the subjacent monocrystalline silicon surface layer 2.

Furthermore, the top portion 9a of the poly silicon layer 9 above the non-volatile memory element ME may comprise sidewall spacers 11. Moreover, the doped regions 12 may comprise low-doped (LDD) and high-doped (HDD) regions. For reason of clarity, these details are not shown here.

After further back end processing, contacts to source, drain, and gate, interconnect structures, and passivation may be provided.

Typically, the SONOS memory device according to the present invention will follow the design rule of semiconductor devices with a 65-nm channel length and below. The width W of the beam-shaped epitaxial silicon layer 4 may be between about 50 and about 100 nm. The thickness of the beam-shaped epitaxial silicon layer 4 is between about 10 nm and 30 nm. The thickness of the residual epitaxial SiGe layer 3b is about 50 nm. The width of the poly silicon layer 9 is about equal to the channel length L. The thickness of the poly silicon layer 9 is between about 10 and about 100 nm.

The thickness of the first silicon dioxide dielectric layer of the charge-trapping stack or ONO stack 8 is between about 1 and about 3 nm. The thickness of the charge-trapping silicon nitride layer of the charge-trapping stack 8 is between about 4 and about 10 nm. The thickness of the second silicon dioxide dielectric layer of the charge-trapping stack 8 is between about 4 and about 10 nm.

It is noted that the thickness of the residual epitaxial SiGe layer 3b is equal to the thickness of twice the ONO stack or charge-trapping stack 8 plus the poly silicon layer 9 located between the beam-shaped epitaxial silicon layer 4 and the monocrystalline silicon surface layer 2.

Figure 3A:
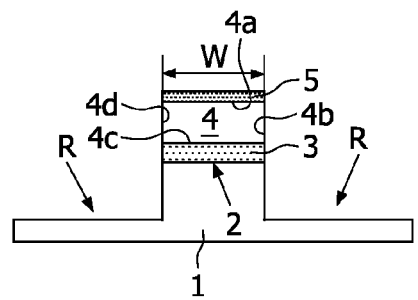
FIGS. 3a, 3b, 3c show the non-volatile memory element after a first processing step in the first, second, and third cross-sectional views, respectively.
Figure 3B:
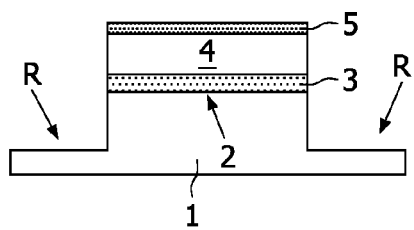
Figure 3C:
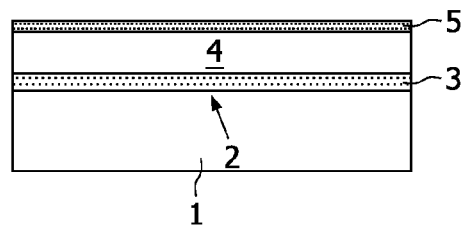

FIGS. 3a, 3b, 3c show the SONOS non-volatile memory device after a first processing step in the first, second, and third cross-sectional views, respectively.

An epitaxial SiGe layer 3 is deposited on a semiconductor substrate 1 with a monocrystalline silicon surface layer 2. On top of the SiGe layer 3, an epitaxial Si layer 4 is formed, which is covered by a capping layer 5. The capping layer 5 is typically a silicon nitride layer. The capping layer 5 may typically have a thickness of between about 20-30 nm and about 100 nm.

Next, a mask (not shown) is provided for defining fin-shaped structures having a width W. Subsequently, the fin-shaped structures are created through etching of recesses R that flank each fin-shaped structure. The recesses R extend into the semiconductor substrate 1 below the silicon surface layer 2.

Figure 4A:
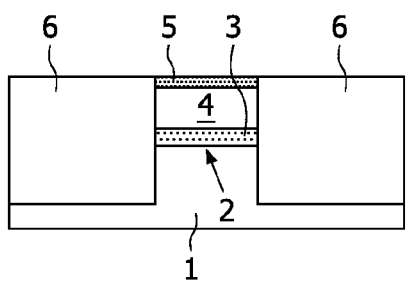
FIGS. 4a, 4b, 4c show the non-volatile memory element after a second processing step in the first, second, and third cross-sectional views, respectively.
Figure 4B:
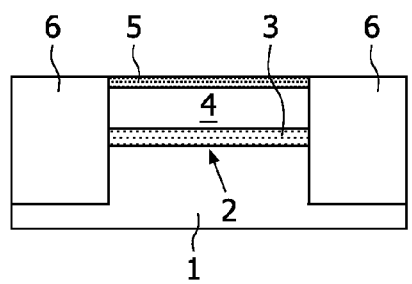
Figure 4C:
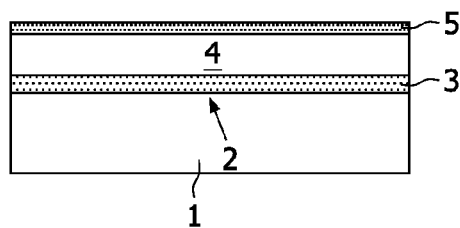

FIGS. 4a, 4b, 4c show the SONOS non-volatile memory device after a second processing step in the first, second, and third cross-sectional views, respectively.

In a further processing step, silicon dioxide is deposited on the semiconductor substrate 1 to fill the recesses R as field oxide 6. Next, a chemical-mechanical polishing (CMP) step is carried out to level the silicon dioxide with the capping layer 5, which acts as stopping layer for the CMP step.

FIGS. 5a, 5b, 5c show the SONOS non-volatile memory device after a next processing step in the first, second, and third cross-sectional views, respectively.

In this processing step, an etch-back of the field oxide 6 is carried out. The amount of silicon dioxide that is removed by the etch-back is such that the surface level of the etched field oxide 6 is below the level of the silicon surface layer 2. Subsequently, the capping layer 5 is removed by a selective etch.

FIGS. 6a, 6b, 6c show the SONOS non-volatile memory device after a further processing step in the first, second, and third cross-sectional views, respectively.

In this processing step, the epitaxial SiGe layer 3 is removed by a highly selective etching process. The etching process may be a dry etching process or a wet etching process.

The etching process is controlled so as to avoid overetching. The etching should only remove the epitaxial SiGe layer over an etching distance substantially equal to the width W of the fin-shaped structure defined earlier. In this process, the epitaxial SiGe layer 3 below the epitaxial Si layer 4 acts as a sacrificial layer and is completely removed, as is shown in the cross-section A-A of FIG. 6a. At this stage, the beam-shaped epitaxial Si layer 4 in this cross-section has free-standing surfaces 4a, 4b, 4c, 4d all-round.

The control of the etching process is arranged to ensure that residual epitaxial SiGe layers 3b remain in the drain region D and source region S.

As shown in cross-section B-B of FIG. 6b, controlling the etching of the epitaxial Si—Ge layer 3 in this processing step enables a residual epitaxial SiGe layer 3b to remain below the epitaxial Si layer in the drain region D, since the width of the drain region is greater than the width of the memory element ME as described above.

Also, as shown in cross-section C-C of FIG. 6c, a residual epitaxial SiGe layer 3b remains below the epitaxial Si layer in the common region S, since the width of the source region is greater than the width of the memory element ME as described above.

Typically, a dry etching process for the removal of SiGe is based on fluorine chemistry.

A gap 7 is present between the two residual epitaxial SiGe layers 3b so as to separate the monocrystalline silicon surface 2 from the epitaxial Si layer 4. The etching process creates a free-standing beam consisting of the epitaxial Si layer 4 over the length of the gap 7.

Note that, although the cross-section of the epitaxial Si layer 4 is rectangular here, it may have a different cross-sectional shape, for example circular or triangular. In view of the present invention, only the fact that a free-standing cross-section of the epitaxial Si layer 4 is obtained is a basic requirement.

FIGS. 7a, 7b, 7c show the SONOS non-volatile memory device after a successive further processing step in the first, second, and third cross-sectional views, respectively.

Next, a silicon dioxide-silicon nitride-silicon dioxide, or ONO, stack 8 is formed.

First, the first silicon dioxide layer of the stack is formed, preferably by oxidation of the exposed silicon areas 2, 4. Then, a silicon nitride layer is deposited by chemical vapor deposition. Finally, a second silicon dioxide layer is deposited.

Subsequently, a mask (not shown) is applied such that a subsequent etching process can remove the ONO stack 8 in areas where other devices such as, for example, an access transistor (not shown) are to be created.

FIGS. 8a, 8b, 8c show the SONOS non-volatile memory device after yet a further processing step in the first, second, and third cross-sectional views, respectively.

In this processing step, a poly silicon layer 9 is deposited by chemical vapor deposition (CVD) which provides a conformal growth of the poly-Si layer 9.

It is observed that filling of horizontal gaps such as gap 7 is achievable by CVD of poly-Si.

FIGS. 9a, 9b, 9c show the SONOS non-volatile memory device after a subsequent processing step in the first, second, and third cross-sectional views, respectively.

A mask M1 is provided in the gate region G to cover the poly silicon layer 9 in this location. Next, an etching process is carried out to pattern the poly-Si layer 9. As a result the poly-Si layer remains in the gate region G. In the source and drain regions S, D the poly Si layer 9 is removed, as is shown in FIGS. 2b and 2c. Note that the ONO stack 8 is also removed by the poly Si etching process in the drain region D, as is apparent from FIG. 2b.

It is further noted that the poly Si layer 9 is preferably removed from the gap regions 10 adjacent to the poly Si layer 9 in the space between the epitaxial Si layer 4 and the monocrystalline silicon surface layer 2. However, the poly Si layer 9 may remain in the gap regions 10 if the poly silicon layer 9 is properly removed from the top surface 4a of the epitaxial silicon layer 4.

Next, the (remainder of the) mask M1 is removed.

After a still further processing step, the SONOS non-volatile memory device is as shown in FIGS. 2a, 2b, 2c.

Source and drain regions S, D are doped in a suitable implantation process using the poly silicon layer 9 as selfaligned mask. Optionally, spacers 11 may be formed on the side walls of the top poly silicon layer 9a. For example, a low-doped (LDD) region and a high-doped (HDD) region are formed. The implantation process creates doped regions 12 in the portions of the epitaxial silicon layer 4 not covered by the poly silicon layer 9, which were exposed to the implantation.

After the doped regions S, D have been provided, further back end processing may be carried out, such as providing contacts to source, drain, and gate, providing interconnect structures, and passivation.

The presence of the ONO stack 8 on all sides of the epitaxial silicon layer 4 gives the memory device improved short-channel properties.

Note that, if the capping layer 5 remains on top of the beam-shaped epitaxial Si layer 4 during all steps shown in FIGS. 6a-6c to 9a-9c at the stage shown in FIG. 5a, then the embodiment of the non-volatile memory device of FIGS. 2d and 2e may be obtained. The capping layer 5 can act as a mask for the dopant implantation process as described above with reference to FIGS. 9a-9c.

FIGS. 10a, 10b, 10c show the SONOS non-volatile memory device after an alternative processing step in the first, second, and third cross-sectional views, respectively.

In an alternative implantation process, the dopants penetrate right through the residual epitaxial SiGe layer 3b. In that case, the doped regions 12 extend into the semiconductor substrate region 2, 1. The SONOS memory device thus comprises two parallel transistors, an upper transistor and a lower transistor.

The upper transistor is substantially equal to the transistor comprised in the SONOS memory device shown in FIGS. 9a, 9b, 9c. The lower transistor is not optimized for short-channel effects because the ONO stack 8 is not completely wrapped around the epitaxial silicon layer 4. Advantageously, the SONOS memory device of FIGS. 10a, 10b, 10c can achieve a higher read current, which may result in a faster read access, i.e. a shorter read access time.

Figure 11:
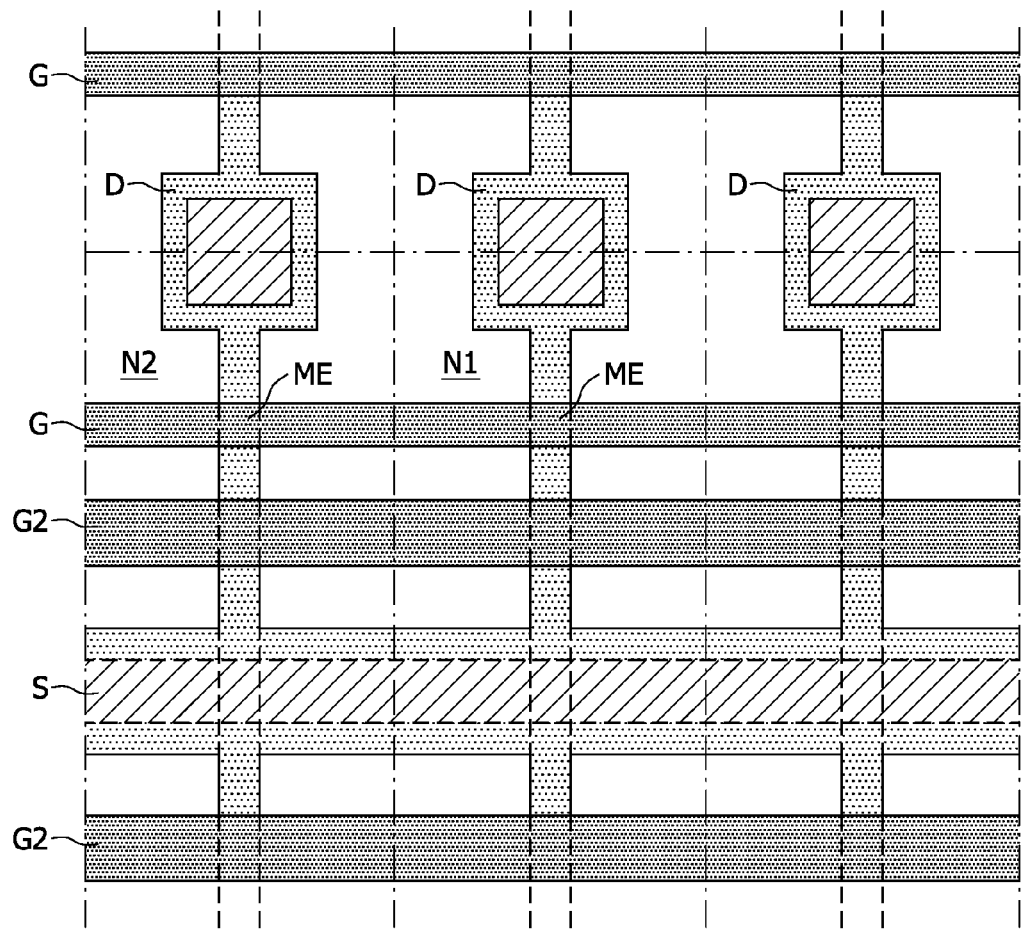
FIG. 11 is a plan view of a non-volatile memory element according to a further embodiment of the present invention.

FIG. 11 is a plan view of a non-volatile memory device according to a further embodiment of the present invention. This further embodiment shows an arrangement with an additional gate line G2 parallel to the poly gate line G.

The additional gate line G2 may be an access gate, while the poly gate line G is a control gate. Those skilled in the art will readily appreciate how to manufacture the non-volatile memory device according to this further embodiment in view of the description given above.

Furthermore, it is noted that the poly silicon layer 9 may be replaced by a metal or metal nitride layer or a combination of a metal (nitride) and poly silicon. The metal may be Ti, Ta, TiN, or TaN.

The ONO stack 8 which serves as a charge-trapping stack may alternatively be formed from materials which have functions similar to those of the silicon dioxide and silicon nitride layers.

One or each of the silicon dioxide layers may be replaced by a high-K material such as hafnium oxide $HfO_2$, hafnium silicate $Hf_xSi_{1-x}O_2$ ($0 \leq x \leq 1$), hafnium silicate-nitride HfSiON, aluminum oxide $Al_2O_3$, or zirconium oxide $ZrO_2$.

Moreover, the silicon nitride layer may be replaced by a high-K trapping material, e.g. a layer of silicon nanocrystals or a suitable high-K material layer.

In an alternative embodiment, the SONOS memory device according to the present invention may be manufactured on a SOI semiconductor substrate (SOI: silicon on insulator). On the silicon surface layer of the SOI substrate, the epitaxial Si—Ge layer 3 is deposited, on top of which an epitaxial Si layer 4 is formed, covered by a capping layer 5. In that case the etching as described with reference to FIGS. 3a, 3b, 3c is simplified since the buried oxide layer of the SOI substrate can be used as a stopping layer. The isolation of adjacent devices is automatically obtained after the etching described with reference to FIGS. 3a,b,c. The processing of STI and the recess of field oxide can be omitted.

The invention claimed is:

1. A non-volatile memory device on a semiconductor substrate, comprising:
   a source region, a drain region, and a gate;
   a channel region disposed within a beam-shaped semiconductor layer and extending in a first direction between the source and drain regions and having lateral surfaces that extend parallel to the first direction, the beam-shaped semiconductor layer including portions thereof free-standing over a gap region between the portions and the semiconductor substrate; and
   a memory element between the channel region and the gate, and including a charge-trapping stack which covers said lateral surfaces, the charge-trapping stack including a lower surface adjacent a bottom surface of the beam-shaped semiconductor layer and side surfaces directly connecting to the lower surface so as to embed the beam-shaped semiconductor layer in a U-shaped form of the charge-trapping stack.

2. A non-volatile memory device in accordance with claim 1, wherein:
   the charge-trapping stack covers each of the lateral surfaces so as to wrap the beam-shaped semiconductor layer.

3. A non-volatile memory device according to claim 1, wherein the gate is disposed over the memory element such that the gate contacts the charge-trapping stack on each of the lateral surfaces of the beam-shaped semiconductor layer.

4. A non-volatile memory device according to claim 1, wherein the gate comprises a poly-silicon layer.

5. A non-volatile memory device according to claim 1, wherein the gate comprises either a metal layer or a metal-nitride layer.

6. A non-volatile memory device according to claim 1, wherein the gate comprises a combination of a poly-silicon layer and either a metal layer or a metal-nitride layer.

7. A non-volatile memory device according to claim 1, wherein an epitaxial SiGe layer is disposed between the source and drain regions.

8. A non-volatile memory device according to claim 1, wherein the charge-trapping stack is a stack comprising a first silicon dioxide layer, a silicon nitride layer, and a second silicon dioxide layer.

9. A non-volatile memory device according to claim 8, wherein at least one of the first and second silicon dioxide layers is replaced by a layer of a high-K material.

10. A non-volatile memory device according to claim 8, wherein the silicon nitride layer is replaced by a layer of a high-K material capable of trapping charge.

11. A non-volatile memory device according to claim 9, wherein the high-K material is one of hafnium oxide ($HfO_2$), hafnium silicate ($Hf_xSi_{1-x}O_2$ [$0 \leq x \leq 1$]), hafnium silicate-nitride (HfSiON), aluminum oxide ($Al_2O_3$) or zirconium oxide ($ZrO_2$).

12. A non-volatile memory device according to claim 10, wherein the layer of high-K material capable of trapping charge comprises silicon nanodots.

13. Memory device array comprising at least one non-volatile memory device in accordance with claim 1.

14. A semiconductor device comprising at least one non-volatile memory device in accordance with claim 1.

15. The device of claim 1, wherein at least a portion of each of the source and drain regions are respectively in the free-standing portions of the beam-shaped semiconductor layer.

16. The device of claim 1, wherein the memory element is immediately adjacent respective gaps between the free-standing portions of the beam-shaped semiconductor layer and the substrate, thereby mitigating short-channel effects in the channel region.

17. The device of claim 1, wherein respective portions of the source and drain regions are wider than the charge-trapping stack.

18. The device of claim 1, wherein the beam-shaped semiconductor layer is between about 50 nm and 100 nm in width along a lateral direction that is longer than a thickness of the beam-shaped semiconductor layer in a perpendicular direction to the lateral direction, the thickness being between about 10 nm and 30 nm, the layer having a width and thickness that mitigate short-channel effects.

19. The device of claim 1, further including a material support between respective end portions of the beam-shaped semiconductor layer and the substrate and configured and arranged to suspend the beam-shaped semiconductor layer so that a portion thereof is free-standing over the substrate, the thickness of the material support being thicker than the charge-trapping stack and configured and arranged to facilitate formation of the charge-trapping stack on the bottom surface of the beam-shaped semiconductor layer.

20. The device of claim 1, wherein the source region, drain region, gate and channel region are a transistor, further including a parallel transistor having a channel region in the substrate below the channel region in the beam-shaped semiconductor layer.

21. The device of claim 1, wherein the portion of the channel region free-standing over the semiconductor substrate includes a lower surface separated from the semiconductor substrate by the gap region and having the charge-trapping stack layered thereupon, wherein the gate includes a portion laterally adjacent the gap and between the lower surface of the channel region and the semiconductor substrate, the gate and the free-standing portion of the channel region being laterally between the source and drain regions.

22. Method of manufacturing a non-volatile memory device on a semiconductor substrate, the non-volatile memory device comprising a source region, a drain region, a channel region, a memory element, and a gate, the channel region extending in a first direction between the source region and the drain region and being disposed within a beam-shaped semiconductor layer having a portion thereof free-standing over a gap region between the portion and the substrate; the gate being disposed near the channel region; the memory element being disposed in between the channel region and the gate, the method comprising the steps of:
creating the beam-shaped semiconductor layer for accommodating the channel region, the beam-shaped semiconductor layer extending in the first directions between source and drain regions and having lateral surfaces that extend parallel to the first direction and having the portion thereof free-standing over the substrate, and providing as a memory element a charge-trapping stack between the channel region and the gate, which covers said lateral surfaces, with at least a lower surface directed towards the semiconductor surface layers and side surfaces being directly connecting to the lower surface so as to embed the beam-shaped semiconductor layer in a U-shaped form of the charge trapping stack.

23. Method of manufacturing a non-volatile memory device on a semiconductor substrate (1) in accordance with claim 22, the method comprising the step of:
providing as a memory element a charge-trapping stacks which covers each of the lateral surfaces of the beam-shaped semiconductor layer so as to wrap the beam-shaped semiconductor layer.

24. Method according to claim 22, wherein the method comprises the step of: disposing the gate over the memory element such that the gate contacts the charge-trapping stack on at least the lower surface directed towards the surface layer and the side surfaces which are directly connecting to the lower surface of the lateral surfaces of the beam-shaped semiconductor layer.

25. Method according to claim 22, wherein the semiconductor substrate comprises a stack of an epitaxial sacrificial layer and an epitaxial semiconductor layer,
wherein the creation of the beam-shaped semiconductor layer for accommodating the channel region comprises a removal of the epitaxial sacrificial layer below the epitaxial semiconductor layer.

26. An apparatus comprising:
an elongated structure having a portion thereof free-standing over an underlying material and separated therefrom by a gap region, the elongated structure including doped regions free-standing over the underlying material, the doped regions including source and drain regions separated by a channel region;
a charge-trapping stack around the channel region of the elongated structure and having a lower portion thereof between the elongated structure and the underlying material, the charge-trapping stack being configured and arranged to store charge as a non-volatile memory value; and
a gate around the charge-trapping stack and including a portion between the charge-trapping stack and the underlying material, the gate and the charge-trapping stack being between the free-standing portions of the elongated structure that include the doped source and drain regions.

27. The apparatus of claim 26, wherein the charge-trapping stack has a length that is at least three times its width and is configured and arranged to mitigate short-channel effects between the channel region and portions of the source and drain regions in the elongated structure adjacent the channel region and free-standing over the underlying material.

* * * * *